(12) United States Patent
Laforet et al.

(10) Patent No.: US 11,764,272 B2
(45) Date of Patent: Sep. 19, 2023

(54) SEMICONDUCTOR DEVICE AND METHOD OF MANUFACTURING THE SAME

(71) Applicant: Infineon Technologies Austria AG, Villach (AT)

(72) Inventors: David Laforet, Villach (AT); Cesar Augusto Braz, Villach (AT); Alessandro Ferrara, Villach (AT); Cédric Ouvrard, Munich (DE); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 112 days.

(21) Appl. No.: 17/321,602

(22) Filed: May 17, 2021

(65) Prior Publication Data
US 2021/0367045 A1 Nov. 25, 2021

(30) Foreign Application Priority Data

May 20, 2020 (EP) .................................. 20175849

(51) Int. Cl.
*H01L 29/40* (2006.01)
*H01L 29/06* (2006.01)
*H01L 29/423* (2006.01)

(52) U.S. Cl.
CPC ........ *H01L 29/407* (2013.01); *H01L 29/0696* (2013.01); *H01L 29/4236* (2013.01)

(58) Field of Classification Search
CPC .......................... H01L 29/407; H01L 29/0696; H01L 29/4236
USPC ....................................................... 257/330
See application file for complete search history.

(56) References Cited

U.S. PATENT DOCUMENTS

| | | | |
|---|---|---|---|
| 8,907,418 B2 | 12/2014 | Noebauer et al. | |
| 9,252,263 B1 | 2/2016 | Vielemeyer et al. | |
| 10,181,511 B2 * | 1/2019 | Poelzl | H01L 29/0696 |
| 10,629,595 B2 | 4/2020 | Ouvrard et al. | |
| 2012/0061753 A1 * | 3/2012 | Nishiwaki | H01L 29/407 |
| | | | 257/E29.264 |
| 2014/0084332 A1 * | 3/2014 | Lee | H01L 29/7397 |
| | | | 257/139 |

(Continued)

OTHER PUBLICATIONS

Breglio, G., et al., "Electro-Thermal instablility in low voltage Power MOS: Experimental characterization", IEEE Xplore, 1999, pp. 233-236.

*Primary Examiner* — Igwe U Anya
(74) *Attorney, Agent, or Firm* — Murphy, Bilak & Homiller, PLLC

(57) ABSTRACT

The disclosure relates to a semiconductor device having a first active region, a plurality of elongated gate regions having an elongated extension in a first lateral direction, respectively, a plurality of elongated field plate regions having an elongated extension in the first lateral direction, respectively, and a first additional gate region, wherein a first one of the elongated gate regions is arranged in a first elongated gate trench at a first side of the first active region, and a second one of the elongated gate regions is arranged in a second elongated gate trench at a second side of the first active region, the second side lying opposite to the first side with respect to a second lateral direction, and wherein the first additional gate region is arranged in a first additional gate trench which extends at least proportionately in the second lateral direction through the first active region.

14 Claims, 8 Drawing Sheets

(56) References Cited

U.S. PATENT DOCUMENTS

| | | | |
|---|---|---|---|
| 2014/0217495 A1* | 8/2014 | Wutte | H01L 29/7811 |
| | | | 438/652 |
| 2016/0104797 A1* | 4/2016 | Poelzl | H01L 29/404 |
| | | | 257/331 |
| 2016/0268423 A1 | 9/2016 | Koepp et al. | |
| 2017/0110573 A1 | 4/2017 | Laforet et al. | |
| 2017/0250256 A1 | 8/2017 | Siemieniec et al. | |
| 2019/0123139 A1 | 4/2019 | Brown et al. | |
| 2023/0055891 A1* | 2/2023 | Blank | H01L 29/401 |

\* cited by examiner

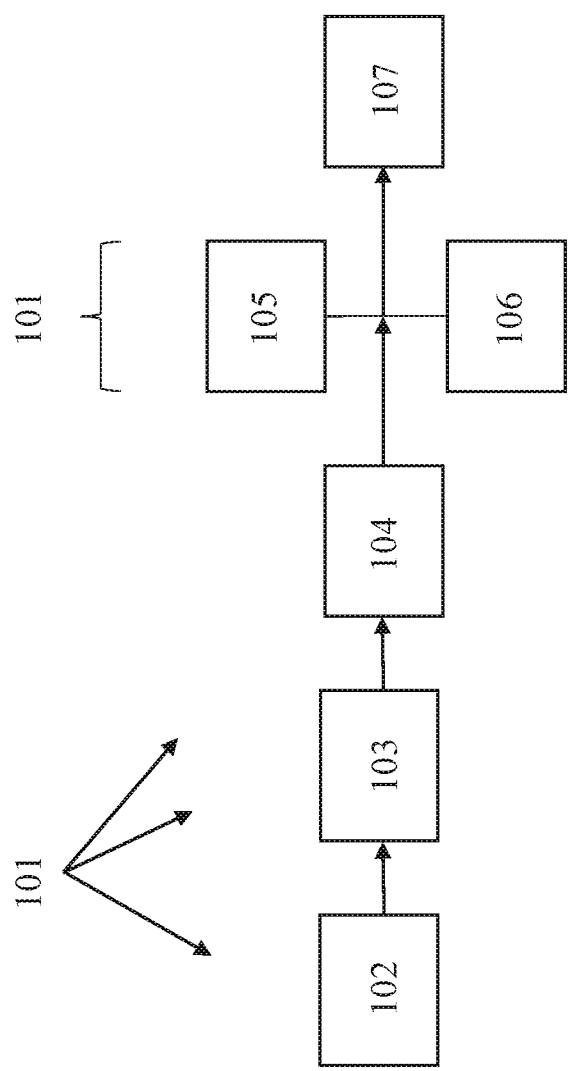

SEMICONDUCTOR DEVICE AND METHOD OF MANUFACTURING THE SAME

TECHNICAL FIELD

The present disclosure relates to a semiconductor device with an active region and gate trenches.

BACKGROUND

In a respective gate trench, a gate region is formed, comprising a gate electrode and a gate dielectric. In a vertical device as disclosed here, the gate dielectric is arranged laterally between the gate electrode and the active region. By applying a voltage to the gate electrode, the formation of a vertical channel in the active region can be controlled. In case of a vertical field effect transistor for instance, the channel can be formed in a body region arranged vertically between a source and a drain region.

SUMMARY

It is an object of the present disclosure to provide a semiconductor device with improved characteristics.

This object is achieved by the features of the claims. The device comprises a first active region arranged between elongated gate trenches, namely between a first elongated gate trench formed at a first side of the active region and a second elongated gate trench formed at a second side thereof. The active region and the elongated gate trenches have their respective length extension in a first lateral direction, and the device furthermore comprises elongated field plate regions which extend in the first lateral direction as well. With respect to a second lateral direction, e.g. perpendicular to the first lateral direction, the first and the second side of the active region lie opposite to each other. The first side of the active region lies directly adjacent to the first gate region, and the second side lies directly adjacent to the second gate region. Furthermore, in addition to the gate trenches extending in the first lateral direction, the device comprises a first additional gate region which is arranged in a first additional gate trench extending at least proportionately in the second lateral direction through the active region.

The additional gate region can create an additional channel locally in the active region, which can for instance have a lower threshold voltage. Therewith, for instance a lower transconductance on the chip level and, in consequence, a lower temperature coefficient δI/δT in linear mode can be achieved. At a high temperature, the device can for example be more stable regarding hotspot formation. Apart from that, the overall channel area can be larger due to the additional gate area, resulting for instance in a lower $R_{on} \cdot A$. The combination of the lower transconductance and the reduced $R_{on} \cdot A$ can extend the safe operating area (SOA) of the device. This can in particular be advantageous in a linear mode application, when the device is neither fully on nor fully off.

Further embodiments and features are provided in this description and in the dependent claims. Therein, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa. In general words, an approach of this application is to provide an active region, which extends in a first lateral direction, and first and second elongated gate regions, which extend in the first lateral direction as well and enclose the active region with respect to a second lateral direction. Furthermore, the device comprises an additional gate region having an at least proportionate extension in the second lateral direction through the active region.

The first and the second lateral direction lie perpendicular to a vertical direction, and they can in particular lie perpendicular to each other as well. The vertical direction lies perpendicular to a surface of a layer of the device, for instance a surface of the semiconductor substrate and/or a surface of an epitaxial layer deposited on the substrate and/or a surface of an interlayer dielectric on which a frontside metallization can be formed. The length of an elongated gate or field plate region, or of a respective trench, is taken in the first lateral direction, wherein the width is taken perpendicularly thereto, e.g. in the second lateral direction. Due to the elongated shape, the length of a respective trench or region can for example be at least a 5-, 10- or 15-fold of its width (depending on the design, upper limits can for instance be a 1000- or 500-fold).

Generally, the elongated gate and/or field plate regions could be tilted slightly with respect to the first lateral direction and to each other. However, in particular, they can be arranged in parallel to each other (and to the first lateral direction), forming a so-called stripe design. Seen in a vertical top view, the trenches, in which the elongated gate and/or field plate regions are formed, can be arranged as parallel stripes, and the active region or regions can have a stripe-shape as well. A respective stripe extends in the first lateral direction, and the different stripes are arranged alternating in the second lateral direction. Compared to other field plate geometries, e.g. spicular or columnar field electrodes, the elongated plate design can for instance allow for a comparably easy tuning of the transfer characteristic by layout measures, e.g. via the angle of the additional gate trench (see in detail below).

A respective gate region comprises a gate electrode which is the electrically conductive part of the gate region. In addition, it comprises a gate dielectric, for instance a gate oxide, like silicon oxide, which electrically isolates the gate electrode from the active area. Via the first and the second gate region, the formation of a respective vertical channel in the first active region can be controlled, namely of a first vertical channel at the first side and of a second vertical channel at the second side.

Generally, the active region can be formed by implants, it can for instance comprise a body and a source region in case of a field effect transistor (FET) or an emitter and a base region in case of an insulated-gate bipolar transistor (IGBT). Depending on the device type, the channel regions will be formed in the body or base region. Further depending on the type, the device can additionally comprise a drain or collector region, e.g. formed at the backside of the device. Vertically between the body/base and the drain/collector region, a drift region can be arranged, which has the same majority charge carriers as the drain/collector region, but a lower doping.

In addition to the first active region, the device can comprise one or more further active regions. The first active region is arranged at a first side of the second gate region, and a second active region can be arranged at a second side thereof, opposite to the first side with respect to the second lateral direction. Likewise, the first active region is arranged at a second side of the first gate region, and a third active region can be arranged at the first side thereof, opposite to the second side with respect to the second lateral direction.

In particular, the additional gate trench or trenches can extend through more than one active region, e.g. through the first active region and in addition through the second and/or the third active region.

In an embodiment, at least a portion of the first additional gate trench extends laterally in parallel to the second lateral direction. In other words, at least this portion of the additional gate trench forms an angle α of 0° with the second lateral direction. Therein, another portion thereof can form another angle with the second lateral direction, or the additional gate trench as a whole can extend in parallel to the second lateral direction.

In an embodiment, at least a portion of the first additional gate trench extends laterally at an angle α of at least 10° to the second lateral direction, further possible lower limits being for instance at least 20° or 30°. The angle α is a cutting angle, namely the smaller one of two congruent angles (the one which is acute). Possible upper limits of the angle α can for instance be 80°, 70° or 60°. The characteristic of the channel formed locally by the additional gate region can depend from the angle α, in particular from the angle α formed at a crossing with an elongated gate region. The adjustment of the angle α can be another degree of freedom to shape to the transfer characteristic by a layout measure, e.g. in addition to the lateral positioning of the additional gate trench. In particular, at different lateral positions of the device, additional gate trenches with different orientations can be arranged, which can allow for an optimization of the safe operating area by a layout measure, see below.

In an embodiment, different portions of the first additional gate trench form different angles with the second lateral direction. A first portion of the additional gate trench can form a first angle $\alpha_1$ and a second portion can form a second angle $\alpha_2$, wherein the angles $\alpha_1$ and $\alpha_2$ are different from each other.

In an embodiment, a bend formed between the portions extending under different angles is arranged laterally between the first and the second elongated gate trench. In other words, the bend is arranged in the first active region (e.g. not at a gate crossing). An adaption of the rounding at the bend, e.g. the radius of curvature, can be a further layout measure for adjusting the device characteristic, for instance for an SOA optimization. A radius of curvature at the bend can for instance be at least 10 nm or 20 nm, possible upper limits being for instance 200 nm, 150 nm or 100 nm.

In an embodiment, the device comprises a second additional gate region formed in a second additional gate trench. Like the first additional gate trench, it extends at least proportionately in the second lateral direction. Any feature disclosed for the first additional gate region or trench shall also be disclosed for the second additional gate region or trench. In particular, the second additional gate trench can extend through the first active region, and for instance additionally through the second and/or third active region.

In an embodiment, at least some of the additional gate trenches have a different orientation with respect to the second lateral direction. In other words, at least a portion of the first additional gate trench can form a third angle $\alpha_3$ with the second lateral direction, and at least a portion of the second additional gate trench can form a fourth angle $\alpha_4$ with the second lateral direction, wherein the angles $\alpha_3$ and $\alpha_4$ are different. The angles can for instance differ by at least 10° or 20°, possible upper limits being for instance 80°, 70° or 60°. At different lateral positions, different angles can be chosen for the additional gate trenches, allowing for an SOA optimization by a layout measure.

In an embodiment, a plurality of additional gate trenches, each extending at least proportionately in the second lateral direction, are distributed laterally over the device with a varying areal density. In a first area of the device, the area share covered by the additional trench or trenches can be larger than in a second area, the areas having the same size and being formed not overlapping. In particular, more additional trenches can be arranged in the first area then in the second area. The first area can for instance be located in the center of the device, wherein more additional trenches there can for example be advantageous in view of the lower $\delta I/\delta T$ coefficient (a temperature profile resulting from the heat dissipation can have a peak in the center of the device). By varying the areal density of the additional gate trenches, e.g. adapting the distance between the additional trenches, an SOA optimization can be achieved by a layout measure.

In an embodiment, the field plate regions are formed below the gate regions in the elongated gate trenches. In particular, a first field plate region is arranged in the first elongated gate trench, and a second field plate region is arranged in the second elongated gate trench. Each of the field plate regions can be covered by an interlayer dielectric formed in the respective elongated gate trench, separating the respective field plate region from the respective gate region above.

In an embodiment, the elongated gate trench or trenches extend deeper than the first additional gate trench. The lower end of the additional gate trench can for instance be arranged vertically above an upper end of the field plate regions, e.g. an upper end of the field electrodes. In particular, the elongated gate trenches extending deeper can additionally comprise the field plate regions below the gate regions. In contrast, the additional gate trench can solely contain the additional gate region, no field plate being formed below.

In an embodiment, the first and the second elongated gate region are connected by the additional gate region or regions. The additional gate trench or trenches can for instance connect the first and the second elongated gate trench with each other. In particular, the gate electrode of a respective additional gate region can electrically connect the gate electrodes of the first and the second gate region with each other.

The disclosure relates also to a method of manufacturing the semiconductor device disclosed here, the method comprising the steps i) forming the first active region;
ii) etching the first and the second elongated gate trench;
iii) forming the elongated field plate regions;
iv) forming the first and the second elongated gate region;
v) etching the first additional gate trench;
vi) forming the first additional gate region.

The formation of the active region can for instance comprise an implantation, e.g. for forming the body/source or base/collector regions, see above. In particular, the active region can be formed in an epitaxial layer, e.g. epitaxial silicon deposited on a silicon substrate. Therein, a subsequent and/or an intrinsic doping during the epitaxial deposition is possible, e.g. for forming the drift region. Generally, the numbering of the steps above shall not imply a specific order, the active region can for instance be formed after etching the gate trenches, in particular after forming the gate regions.

In an embodiment, the additional gate trench or trenches are etched prior to the formation of the elongated gate regions. Then, the latter can be formed simultaneously with the additional region or regions. For instance, the additional gate trench or trenches can be etched in a separate process step after the elongated gate trenches, in particular after the formation of the elongated field plate regions.

The disclosure also relates to a use of the semiconductor device in a linear mode operation. Depending on the application, the device can be operated in the linear mode in a first mode of operation, and it can for instance be operated in switching mode in a second mode of operation. In the linear mode operation, it is neither fully on nor fully off, in contrast to the switching mode operation.

In particular, the device can be used for limiting an inrush current, acting for instance as a fuse. It can for example be used in a power supply redundancy system, e.g. with a battery backup, for instance in a power system of a telecommunication or server application. Such a power supply must for instance not provoke any transients in the bus voltage of the system, in particular when it is hot-connected thereto. Moreover, it shall be able to quickly disconnect itself from the system bus, for instance in case of an internal short-circuit event.

BRIEF DESCRIPTION OF THE DRAWINGS

Below, the device and the manufacturing are explained in further detail by means of exemplary embodiments. Therein, the individual features can also be relevant for this application in a different combination.

FIG. 10 illustrates the manufacturing of the device in a flow diagram.

DETAILED DESCRIPTION

Figure 1:
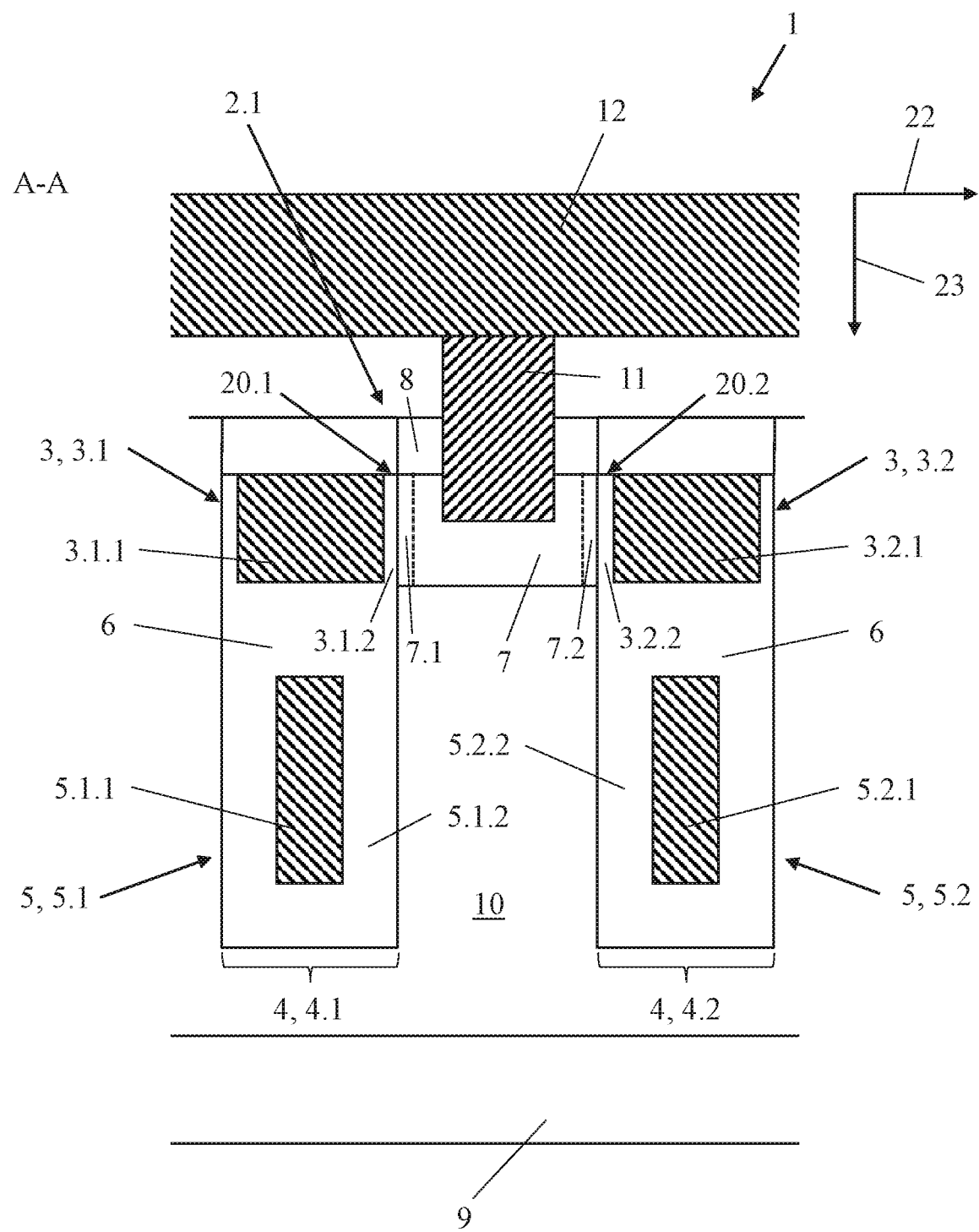
FIG. 1 shows a transistor device with a first and a second elongated gate region in a vertical cross section.

FIG. 1 illustrates a semiconductor device 1 in a vertical cross section. It comprises a first active region 2.1 arranged laterally between elongated gate regions 3 formed in elongated gate trenches 4 together with elongated field plate regions 5 (all of them having their length extension perpendicular to the drawing plane). In detail, a first side 20.1 of the first active region 2.1 lies adjacent to a first elongated gate trench 4.1, in which the first elongated field plate region 5.1 is formed below the first elongated gate region 3.2, separated by an interlayer dielectric 6. A second side 20.2 of the first active region 2.1, which lies opposite to the first side 20.1 with respect to a second lateral direction 22, lies adjacent to a second elongated gate trench 4.2, which contains a second elongated field plate region 5.2 and a second gate region 3.2, separated by an interlayer dielectric 6.

With the respective gate region 3.2, 3.1, the channel formation in a respective channel region 7.1, 7.2 can be controlled. In the example here, the first and the second channel region 7.1, 7.2 are formed in a body region 7, arranged below a source region 8. At the backside of the device 1, a drain region 9 is formed. Between the body region 7 and the drain region 9, a drift region 10 having the same doping type but a lower concentration compared to the drain region 9 is arranged. In the device 1 shown here, the body region 7 and the source region 8 are electrically connected by a contact plug 11 connected to a frontside metallization 12.

Each of the gate regions 3.1, 3.2 comprises a respective gate electrode 3.1.1, 3.2.1 and a respective gate dielectric 3.1.2, 3.2.2 separating the respective gate electrode 3.1.1, 3.2.1 from the active region 2.1. Likewise, each field plate region 5.1, 5.2 comprises a respective field plate electrode 5.1.1, 5.2.1 and a respective field plate dielectric 5.1.2, 5.2.2 separating the respective field plate electrode 5.1.1, 5.2.1 from the drift region 10.

Figure 2:
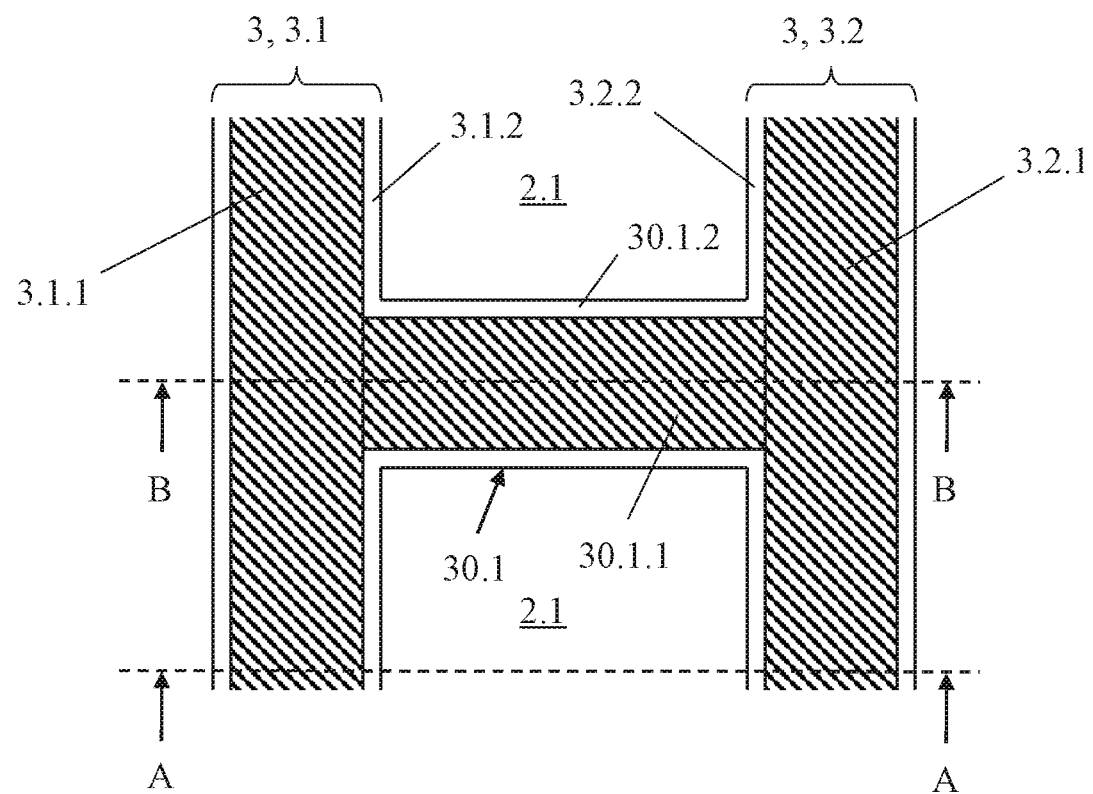
FIG. 2 illustrates the elongated gate regions of FIG. 1 in a top view, together with an additional gate region.
Figure 2:
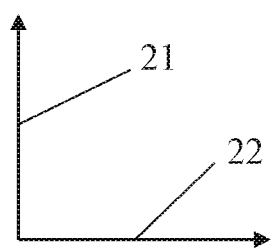

FIG. 2 illustrates the elongated gate regions 3 in a top view. Like the first active region 2.1, they have their length extension in a first lateral direction 21 perpendicular to the second lateral direction 22. A first additional gate region 30.1 extends through the first active region 2.1, in parallel to the second lateral direction 22 in the example here. It comprises a gate electrode 30.1.1 and a gate dielectric 30.1.2 separating the gate electrode 30.1.1 from the active region 2.1. The additional gate region 30.1 enables an additional channel formation in the active region 2.1, see FIGS. 7-10 in detail. The sectional plane A-A of FIG. 1 is indicated in FIG. 2, it is spaced from the first additional gate region 30.1.

Figure 3:
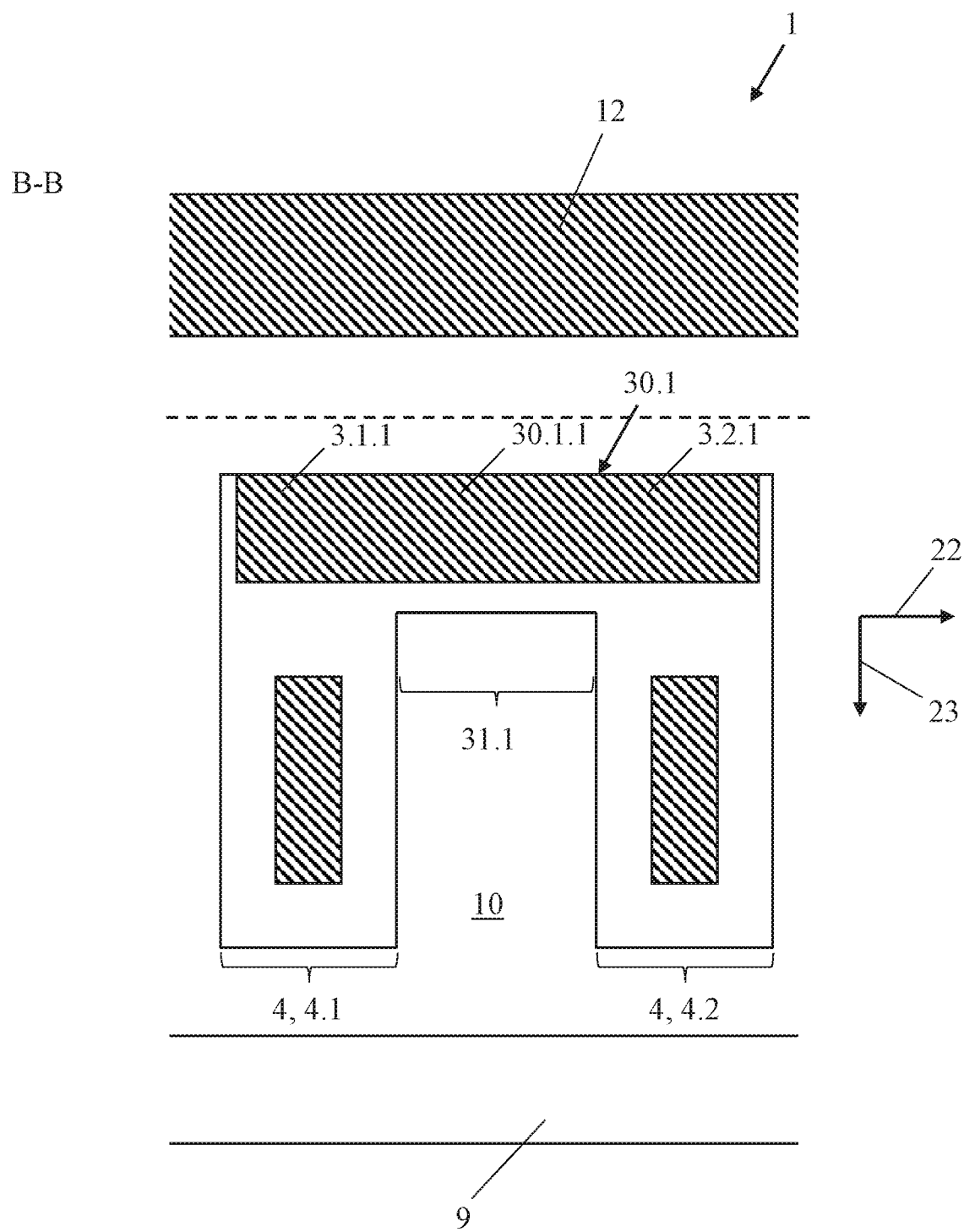
FIG. 3 shows a vertical cross section through the device of FIGS. 1 and 2, the sectional plane lying in the additional gate region.

FIG. 3 illustrates a vertical cross section through the additional gate region 30.1 (see the sectional plane B-B in FIG. 2). Generally, in this description, the same parts or parts with the same function are referenced by the same reference numerals. Like the elongated gate trenches 4, the additional gate trench 31.1 extends in the vertical direction 23 into the drift region 10. Since no field plate region is formed below the additional gate region 30.1, the additional gate trench 31.1 does not extend as deep as the elongated gate trenches 4. The gate electrode 30.1.1 of the additional gate region 30.1 electrically connects the gate electrodes 3.1.1, 3.2.1 of the first and the second gate region 3.1, 3.2.

Figure 4:
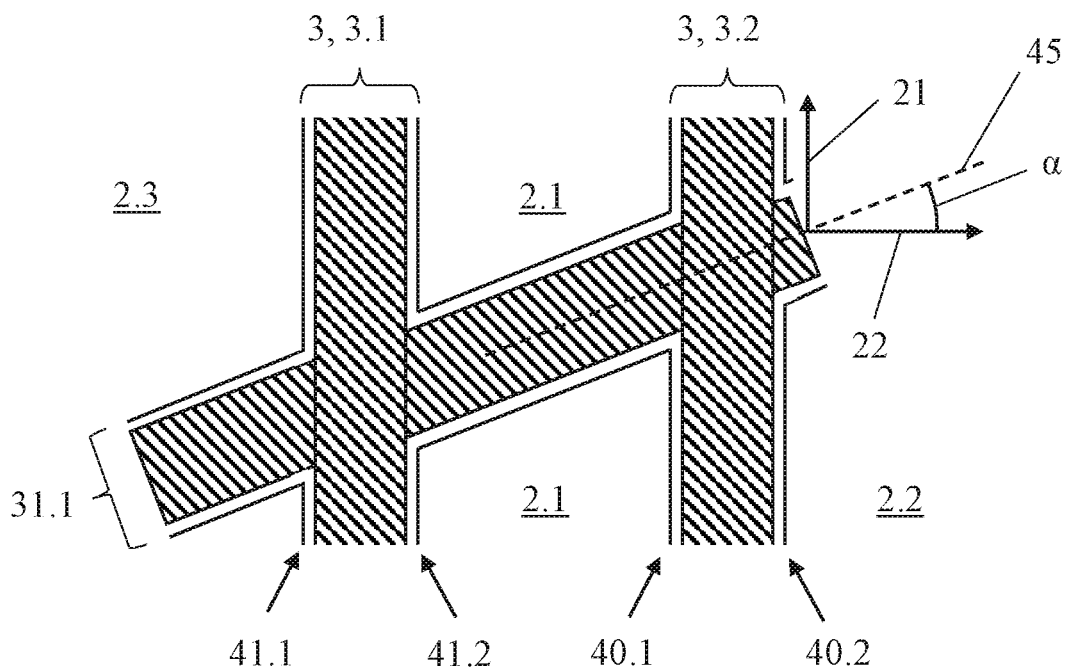
FIG. 4 illustrates an alternative layout of an additional gate region in a top view.

FIG. 4 illustrates an embodiment where the additional gate region 30.1 forms an angle $\alpha$ with the second lateral direction 22. The angle $\alpha$ can influence the transfer characteristic of the device, see FIG. 8 for illustration.

In addition to the first active region 2.1, the device of FIG. 4 comprises a second active region 2.2 arranged at a second side 40.2 of the second elongated gate region 3.2, laterally opposite to its first side 40.1. Furthermore, a third active region 2.3 is arranged at a first side 41.1 of the first elongated gate region 3.1, opposite to its second side 41.2. In the example shown here, the first additional gate trench 31.1 crosses the first and the second gate region 3.1, 3.2 and extends through the first, second and third active region 2.1, 2.2, 2.3.

Figure 5:
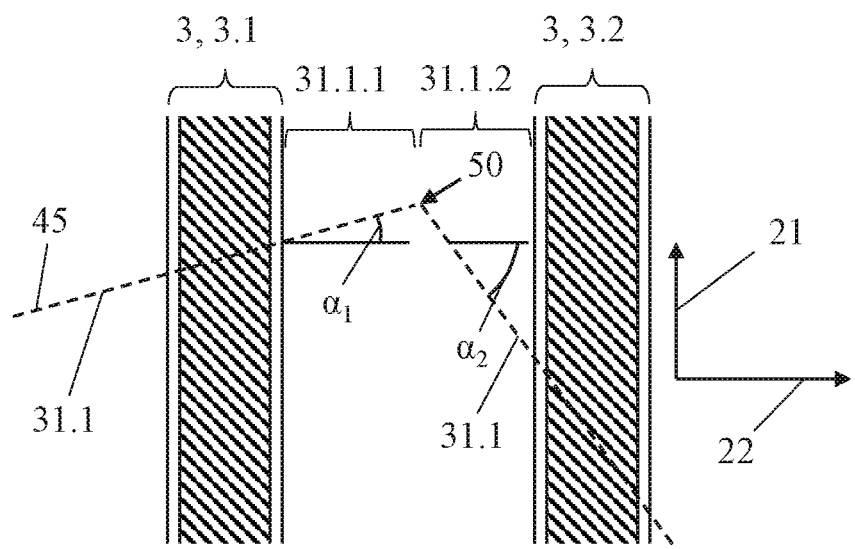
FIG. 5 shows a further alternative layout of an additional gate region in a top view.

In FIG. 5, only the center axis 45 of the first additional gate trench 31.1 is shown for the sake of clarity. In this example, the first additional gate trench 31.1 forms a bend 50, changing its orientation. A first portion 31.1.1 of the additional gate trench 31.1 forms a first angle $\alpha_1$ with the second lateral direction 22, and a second portion 31.1.2 forms a second angle $\alpha_2$. The angles $\alpha_1$ and $\alpha_2$ differ from each other, in the example here they have a different sign and size.

Figure 6:
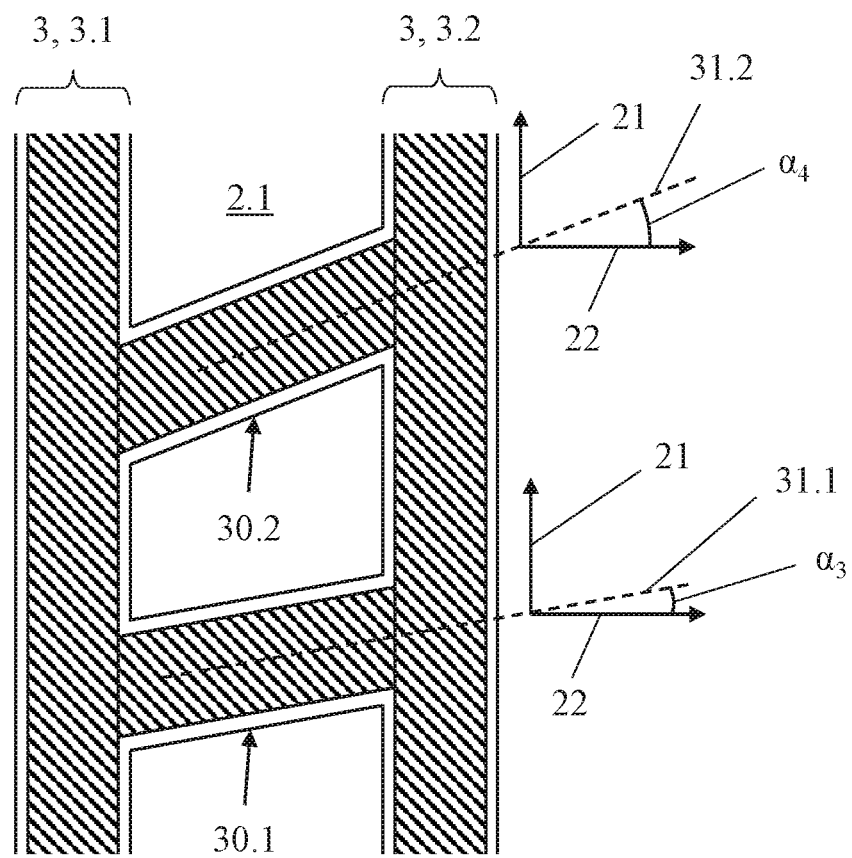
FIG. 6 illustrates a layout with two additional gate regions in a top view.

In the embodiment of FIG. 6, a second additional gate region 30.2 is shown in addition to the first additional gate region 30.1. Therein, the first additional gate trench 31.1 forms a third angle $\alpha_3$ with the second lateral direction 22, and the second additional gate trench 31.2 forms fourth angle $\alpha_4$ with the second lateral direction 22. In this example, the angles $\alpha_3$ and $\alpha_4$ differ in size.

Figure 7:
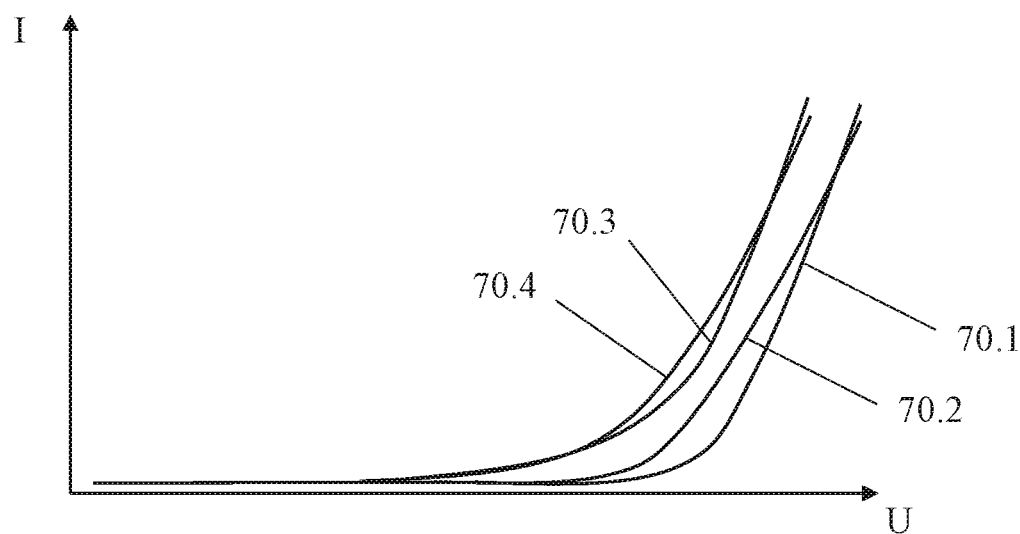
FIG. 7 shows a diagram to illustrate the different transfer characteristic with and without additional gate region at different temperatures.

The diagram of FIG. 7 shows the dependence of the current I from the gate voltage U. A first and a second graph 70.1,70.2 illustrate the behavior of a reference device without an additional gate region. The first graph 70.1 is taken at 300 K and the second graph 70.2 at 400 K. A third and a second graph 70.3, 70.4 illustrate the behavior of a device with an additional gate region, at 300 K (graph 70.3) and 400 K (graph 70.4). With the additional gate region, the threshold is shifted to a lower gate voltage. Further, the additional gate region reduces the temperature dependence, the third and the second graph 70.3, 70.4 show a smaller deviation from each other than the first and the second graph 70.1, 70.2.

Figure 8:
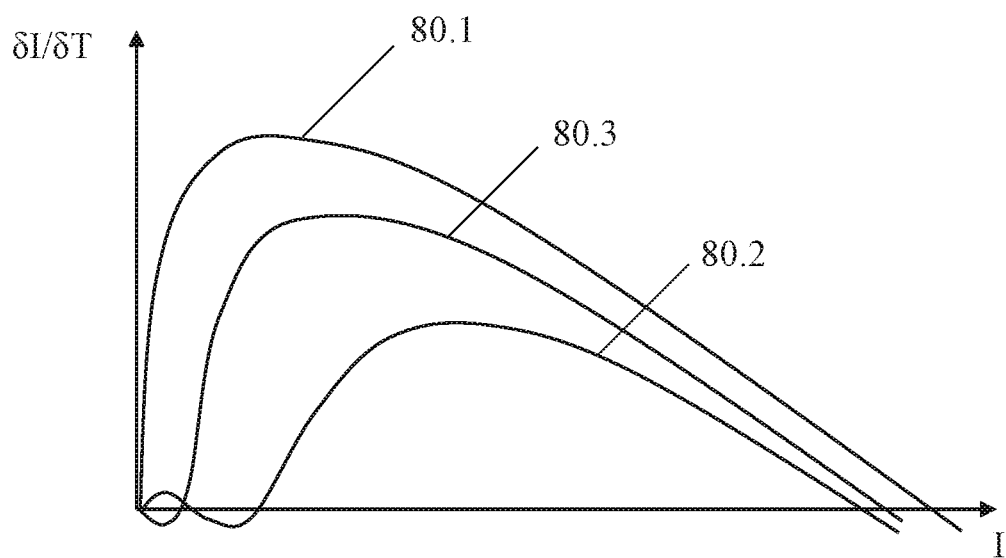
FIG. 8 shows a diagram to illustrate the influence of the orientation of the additional gate region on the temperature coefficient of the current.

This effect on the temperature behavior is illustrated in FIG. 8 showing the temperature coefficient $\delta I/\delta T$ in dependence from the current I. The first graph 80.1 represents the reference sample without an additional gate region. For comparison, the second graph 80.2 illustrates the behavior of a device with an additional gate region, illustrating a significant reduction of the temperature coefficient. This can increase the stability of the device, e.g. the SOA, see in detail above. The second graph 80.2 represents a device where the additional gate trench extends in parallel to the second lateral direction 22. For comparison, the third graph 80.3 represents a device where the additional gate trench forms an angle $\alpha$ of 45° with the second lateral direction. The temperature coefficient is reduced compared to the reference sample but larger than in case of the additional gate trench extending in parallel to the second lateral direction.

Figure 9:
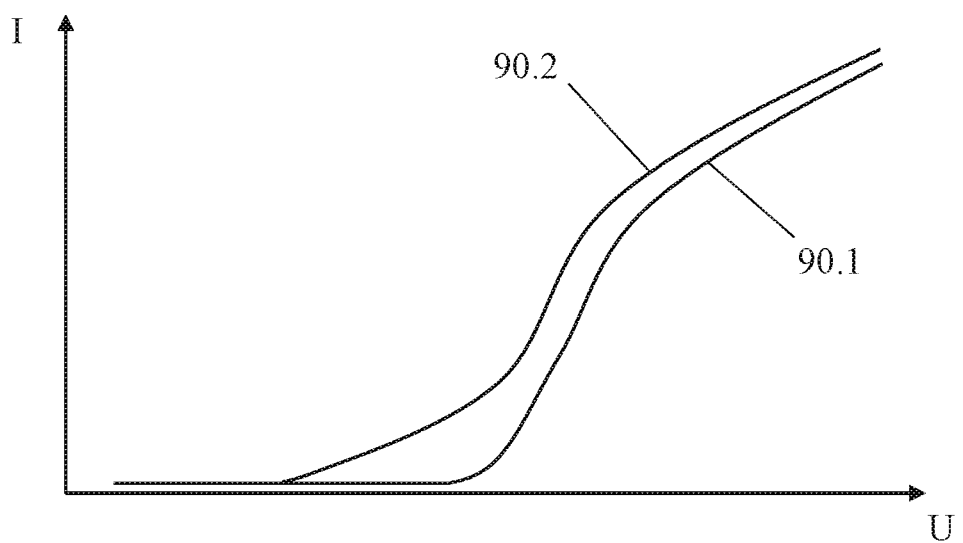
FIG. 9 shows a diagram to illustrate the influence of the additional gate region on the On-resistance.

FIG. 9 illustrates the dependence of the current I from the gate voltage, taken at a small drain-source voltage, e.g. around 0.3 V compared to 10 V in FIG. 7. The first graph 90.1 represents the reference sample without an additional gate region, and the second graph 90.2 is taken at a device with an additional gate trench extending parallelly to the second lateral direction. This comparison illustrates that, in addition to the advantages in linear mode operation, the device can have a reduced On-resistance in switching mode. At the maximum gate voltage, the current is slightly increased for the second graph 90.2.

FIG. 10 shows a flow diagram 100 illustrating some manufacturing steps 101. After etching 102 the elongated gate trenches, the field plate regions can be formed 103. Thereafter, the additional gate trench or trenches can be etched 104. Subsequently, the formation 105 of the elongated gate regions and the formation 106 of the additional gate region or regions can be performed in the same process step 101. The formation 107 of the active region can be performed thereafter (or prior to the gate formation but after the trench etch).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a first active region;
    a plurality of elongated gate regions having an elongated extension in a first lateral direction, respectively;
    a plurality of elongated field plate regions having an elongated extension in the first lateral direction, respectively; and
    a first additional gate region,
    wherein a first one of the elongated gate regions is arranged in a first elongated gate trench at a first side of the first active region,
    wherein a second one of the elongated gate regions is arranged in a second elongated gate trench at a second side of the first active region, the second side lying opposite to the first side with respect to a second lateral direction,
    wherein the first additional gate region is arranged in a first additional gate trench which extends at least proportionately in the second lateral direction through the first active region.

2. The semiconductor device of claim 1, wherein at least a portion of the first additional gate trench extends laterally in parallel to the second lateral direction.

3. The semiconductor device of claim 1, wherein at least a portion of the first additional gate trench extends laterally at an angle $\alpha$ of 10° at minimum and 80° at maximum to the second lateral direction.

4. The semiconductor device of claim 1, wherein a first portion of the first additional gate trench extends laterally at a first angle $\alpha_1$ to the second lateral direction and a second portion of the first additional gate trench extends laterally at a second angle $\alpha_2$ to the second lateral direction, and wherein the angles $\alpha_1$ and $\alpha_2$ are different from each other.

5. The semiconductor device of claim 4, wherein a bend between the first portion and the second portion of the first additional gate trench is arranged laterally between the first elongated gate trench and the second elongated gate trench.

6. The semiconductor device of claim 1, further comprising a second additional gate region arranged in a second additional gate trench which extends at least proportionately in the second lateral direction through the first active region.

7. The semiconductor device of claim 6, wherein a first one of the elongated field plate regions is arranged in the first elongated gate trench below the first elongated gate region, wherein a second one of the elongated field plate regions is arranged in the second elongated gate trench below the second elongated gate region, wherein the first elongated gate trench and the second elongated gate trench delimit the first active region in the first lateral direction, and wherein the first additional gate trench and the second additional gate trench delimit the first active region in the second lateral direction.

8. The semiconductor device of claim 7, wherein in a plan view in a vertical direction perpendicular to the first lateral direction and the second lateral direction, the first active region has a trapezoidal shape with two parallel sides defined by the first elongated gate trench and the second elongated gate trench and two non-parallel sides defined by the first additional gate trench and the second additional gate trench.

9. The semiconductor device of claim 1, further comprising a second additional gate region arranged in a second additional gate trench, wherein at least a portion of the first additional gate trench extends at a third angle $\alpha_3$ to the second lateral direction and at least a portion of the second additional gate trench extends at a fourth angle $\alpha_4$ to the second lateral direction, and wherein the angles $\alpha_3$ and $\alpha_4$ are different from each other.

10. The semiconductor device of claim 1, further comprising a plurality of additional gate regions which are respectively arranged in an additional gate trench, wherein the plurality of additional gate trenches are distributed laterally over the semiconductor device with a varying areal density.

11. The semiconductor device of claim 1, wherein a first one of the field plate regions is arranged in the first elongated gate trench below the first gate region, and wherein a second one of the field plate regions is arranged in the second elongated gate trench below the second gate region.

12. The semiconductor device of claim 1, wherein in a vertical direction perpendicular to the first lateral direction and the second lateral direction, the first elongated gate trench and the second elongated gate trench extend deeper than the first additional gate trench.

13. The semiconductor device of claim 1, wherein the first additional gate region connects the first elongated gate region and the second elongated gate region to one another.

14. The semiconductor device of claim 1, wherein in a vertical direction perpendicular to the first lateral direction and the second lateral direction, the plurality of elongated field plate regions extend deeper than the first additional gate region.

* * * * *